US009381577B2

(12) United States Patent
Iizuka et al.

(10) Patent No.: US 9,381,577 B2
(45) Date of Patent: Jul. 5, 2016

(54) CHUCK TABLE

(71) Applicant: Disco Corporation, Tokyo (JP)

(72) Inventors: Kentaro Iizuka, Tokyo (JP); Masato Terajima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 267 days.

(21) Appl. No.: 14/041,461

(22) Filed: Sep. 30, 2013

(65) Prior Publication Data

US 2014/0091537 A1 Apr. 3, 2014

(30) Foreign Application Priority Data

Oct. 2, 2012 (JP) .................................. 2012-220248

(51) Int. Cl.
*B23B 31/30* (2006.01)
*H01L 21/687* (2006.01)
*H01L 21/683* (2006.01)
*H01L 21/67* (2006.01)

(52) U.S. Cl.
CPC ........ *B23B 31/307* (2013.01); *H01L 21/67288* (2013.01); *H01L 21/6838* (2013.01); *Y10T 279/11* (2015.01)

(58) Field of Classification Search
CPC ............ B23B 31/307; H01L 21/67288; H01L 21/6838; Y10T 279/11
USPC ................................................ 279/3; 269/21
See application file for complete search history.

(56) References Cited

U.S. PATENT DOCUMENTS

| 2,730,370 | A | * | 1/1956 | Brewster | 264/571 |
| 3,809,050 | A | * | 5/1974 | Chough | B28D 5/0094 118/35 |
| 4,603,867 | A | * | 8/1986 | Babb et al. | 279/3 |
| 5,870,271 | A | * | 2/1999 | Herchen | 361/234 |
| 5,930,652 | A | * | 7/1999 | Mukerji et al. | 438/459 |
| 6,279,976 | B1 | * | 8/2001 | Ball | 279/3 |
| 6,466,046 | B1 | * | 10/2002 | Maruyama et al. | 324/754.15 |
| 6,517,130 | B1 | * | 2/2003 | Donoso et al. | 294/185 |
| 6,716,084 | B2 | * | 4/2004 | Basol et al. | 451/4 |
| 6,939,206 | B2 | * | 9/2005 | Ashjaee et al. | 451/41 |
| 6,988,932 | B2 | * | 1/2006 | Ashjaee et al. | 451/5 |
| 7,223,323 | B2 | * | 5/2007 | Yang | A23D 7/00 134/148 |

(Continued)

FOREIGN PATENT DOCUMENTS

| JP | 59201736 A | * | 11/1984 | B23Q 3/08 |
| JP | 03270048 A | * | 12/1991 | H01L 21/68 |

(Continued)

*Primary Examiner* — Eric A Gates
(74) *Attorney, Agent, or Firm* — Greer Burns & Crain, Ltd.

(57) ABSTRACT

A chuck table holds a workpiece having a warp. The chuck table includes a suction holding member having a suction holding surface for holding the workpiece under suction, and an annular seal member provided around the outer circumference of the suction holding member for supporting a peripheral portion of the workpiece. The annular seal member is formed from an elastic member. The upper surface of the annular seal member is set higher in level than the suction holding surface according to the warp of the workpiece. In holding the workpiece on the chuck table under suction, vacuum leaking from the gap between the workpiece and the suction holding surface due to the warp of the workpiece is applied to the space defined by the workpiece and the annular seal member, thereby elastically deforming the annular seal member to flatten the upper surface of the workpiece.

4 Claims, 3 Drawing Sheets

(56) References Cited

U.S. PATENT DOCUMENTS

| | | | |
|---|---|---|---|
| 2002/0182995 A1* | 12/2002 | Shendon et al. | 451/398 |
| 2007/0026772 A1* | 2/2007 | Dolechek et al. | 451/388 |
| 2009/0179366 A1* | 7/2009 | Herchen et al. | 269/21 |
| 2010/0013169 A1* | 1/2010 | Monteen et al. | 279/3 |
| 2013/0334199 A1* | 12/2013 | Yousif | H01L 21/67103 219/446.1 |
| 2014/0191478 A1* | 7/2014 | Oremus | 279/3 |
| 2015/0086301 A1* | 3/2015 | Rogers et al. | 414/217 |

FOREIGN PATENT DOCUMENTS

| | | | | |
|---|---|---|---|---|
| JP | 04064216 A * | 2/1992 | | H01L 21/027 |
| JP | 2005-262249 | 9/2005 | | |
| JP | WO 2012043349 A1 * | 4/2012 | | H01L 21/6838 |

* cited by examiner

CHUCK TABLE

BACKGROUND OF THE INVENTION

1. Field of the Invention

The present invention relates to a chuck table for holding a workpiece such as a wafer.

2. Description of the Related Art

A workpiece such as a wafer having devices formed on the front side is processed by a laser processing apparatus including a laser processing unit, for example. This laser processing apparatus includes a chuck table for holding the workpiece in processing the workpiece. The chuck table has a suction holding member formed of a porous ceramic material. Accordingly, the workpiece is held under suction on the suction holding member of the chuck table. By relatively moving the chuck table holding the workpiece thereon with respect to the laser processing unit, the position of application of a laser beam to the workpiece is changed to allow the processing of the workpiece.

SUMMARY OF THE INVENTION

In some cases, the workpiece to be processed by the laser processing apparatus has a warp to a certain degree. For example, in a lift-off process of separating a plurality of laminated substrates from each other by applying a laser beam, the workpiece has a warp due to the lamination of the substrates. When the workpiece having a warp is placed on the chuck table in such a manner that the peripheral portion of the workpiece is higher in level than the central portion of the workpiece, the peripheral portion of the workpiece floats over the upper surface of the suction holding member, so that the degree of tight contact between the workpiece and the suction holding member becomes low. In this case, the chuck table cannot exert a sufficient suction holding force and therefore cannot properly hold the workpiece.

It is therefore an object of the present invention to provide a chuck table which can properly hold the workpiece having a warp.

In accordance with an aspect of the present invention, there is provided a chuck table for holding a workpiece having a warp thereon, including a suction holding member having an upper surface as a suction holding surface for holding the workpiece under suction; an annular seal member provided so as to surround the outer circumference of the suction holding member, the annular seal member having an upper surface for supporting a peripheral portion of the workpiece held on the suction holding surface, the annular seal member being formed from an elastic member; and a vacuum source connected to the suction holding member for producing a vacuum and applying the vacuum to the suction holding surface; the upper surface of the annular seal member being set higher in level than the suction holding surface according to the warp of the workpiece; whereby when the vacuum produced by the vacuum source is applied to the suction holding surface, the peripheral portion of the workpiece comes into contact with the upper surface of the annular seal member to thereby seal off the vacuum leaking from the gap between the workpiece and the suction holding surface due to the warp of the workpiece, so that the annular seal member is elastically deformed by the vacuum applied to the peripheral portion of the workpiece and the upper surface of the workpiece is therefore flattened to thereby hold the workpiece under suction.

With this configuration, the peripheral portion of the workpiece comes into contact with the annular seal member formed from an elastic member, so that a reduction in airtightness due to the warp can be prevented to thereby properly hold the workpiece under suction. Further, the annular seal member is deformed by the vacuum in holding the workpiece under suction in such a manner that the front side (upper surface) of the workpiece is flattened, so that the processability of the workpiece can be improved. Further, since the annular seal member is deformed by the vacuum in holding the workpiece under suction, a local stress to the workpiece can be relaxed to thereby prevent damage to the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
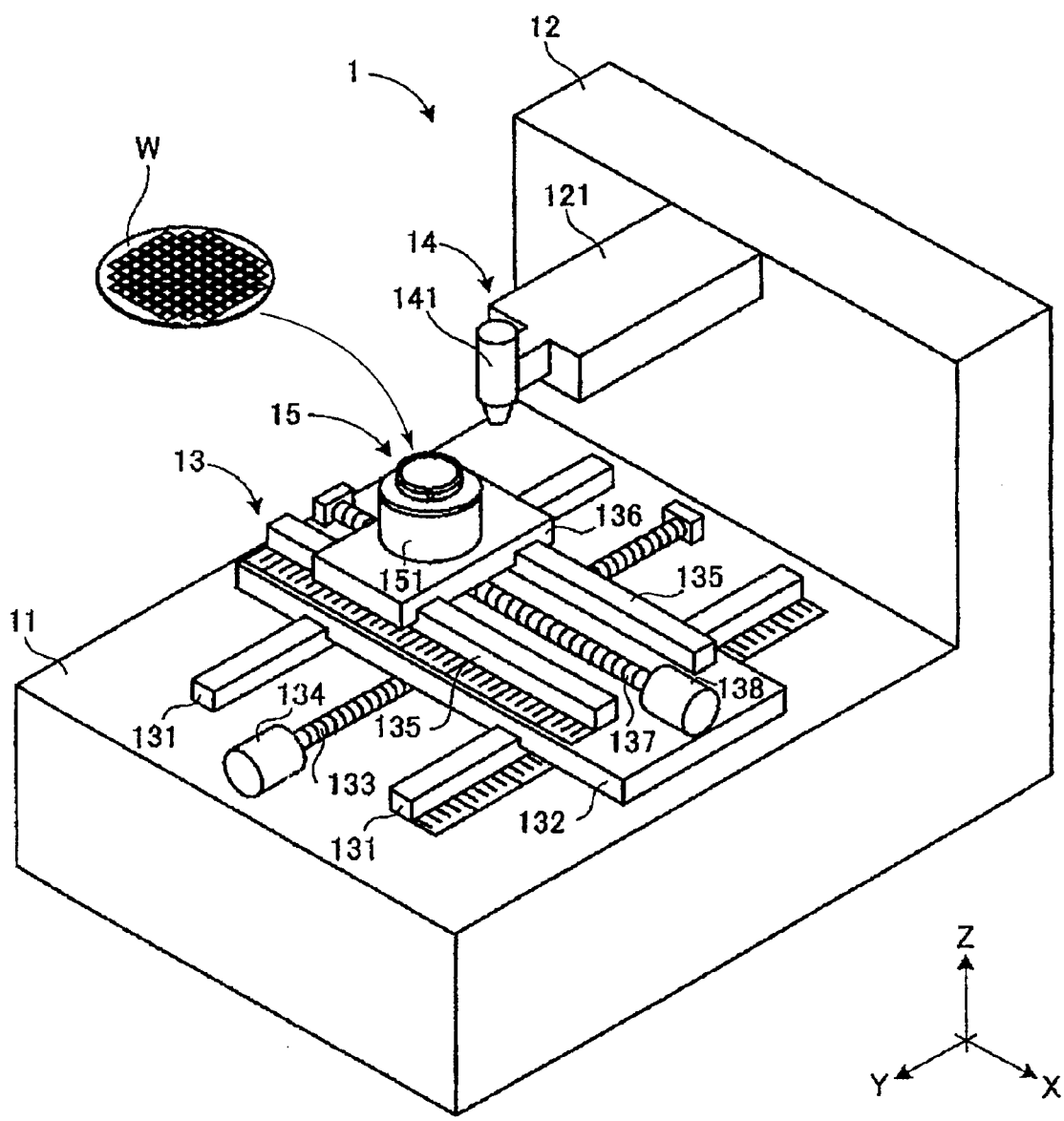
FIG. 1 is a perspective view of a laser processing apparatus including a chuck table according to a preferred embodiment of the present invention.

A preferred embodiment of the present invention will now be described with reference to the attached drawings. FIG. 1 is a perspective view of a laser processing apparatus (processing apparatus) 1 including a chuck table 15 according to this preferred embodiment. A wafer (workpiece) W is also shown in FIG. 1 in relation with the laser processing apparatus 1. The laser processing apparatus 1 is so configured as to apply a laser beam to the wafer W held on the chuck table 15, thereby allowing laser processing of the wafer W.

As shown in FIG. 1, the wafer W is a disk-shaped member. The front side (upper surface) of the wafer W is partitioned into a plurality of regions by a plurality of crossing streets. A plurality of devices are respectively formed in these regions partitioned by the streets on the front side of the wafer W. Preferably, a protective tape (not shown) is attached to the back side or front side of the wafer W coming into contact with the chuck table 15 in holding the wafer W on the chuck table 15 under suction.

The laser processing apparatus 1 has a substantially box-like base 11. There is provided on the upper surface of the base 11 a table moving mechanism 13 for feeding the chuck table 15 in the X direction extending along an X axis shown in FIG. 1 and also indexing the chuck table 15 in the Y direction extending along a Y axis shown in FIG. 1. A wall portion 12 stands from the base 11 at its rear end behind the table moving mechanism 13. The wall portion 12 is provided with an arm portion 121 projecting frontward. A laser processing unit 14 is supported to the arm portion 121 so as to be opposed to the chuck table 15.

The table moving mechanism 13 includes a pair of guide rails 131 provided on the upper surface of the base 11 so as to extend in the Y direction and a Y-axis table 132 slidably supported to the guide rails 131. The table moving mechanism 13 further includes a pair of guide rails 135 provided on the upper surface of the Y-axis table 132 so as to extend in the X direction and an X-axis table 136 slidably supported to the guide rails 135.

A θ table 151 is provided on the upper surface of the X-axis table 136 so as to be rotatable about a Z axis shown in FIG. 1, and the chuck table 15 supported to this θ table 151. Nut portions (not shown) are provided on the lower surfaces of the Y-axis table 132 and the X-axis table 136, and ball screws 133 and 137 are threadedly engaged with these nut portions of the Y-axis table 132 and the X-axis table 136, respectively. Drive motors 134 and 138 are connected to the end portions of the ball screws 133 and 137, respectively. Accordingly, when the ball screws 133 and 137 are rotationally driven by the drive motors 134 and 138, respectively, the chuck table 15 is moved in the Y direction and the X direction along the guide rails 131 and 135, respectively.

The laser processing unit 14 includes a focusing unit 141 provided at the front end of the arm portion 121. The focusing unit 141 includes an optical system having a focusing lens (not shown). The laser processing unit 14 further includes an oscillator (not shown) for oscillating a laser beam. The laser beam oscillated by the oscillator is focused by the focusing lens and applied to the wafer W held on the chuck table 15. The chuck table 15 is relatively moved with respect to the laser processing unit 14 to thereby change the position of application of the laser beam to the wafer W, thus allowing the processing of the wafer W.

Figure 2:
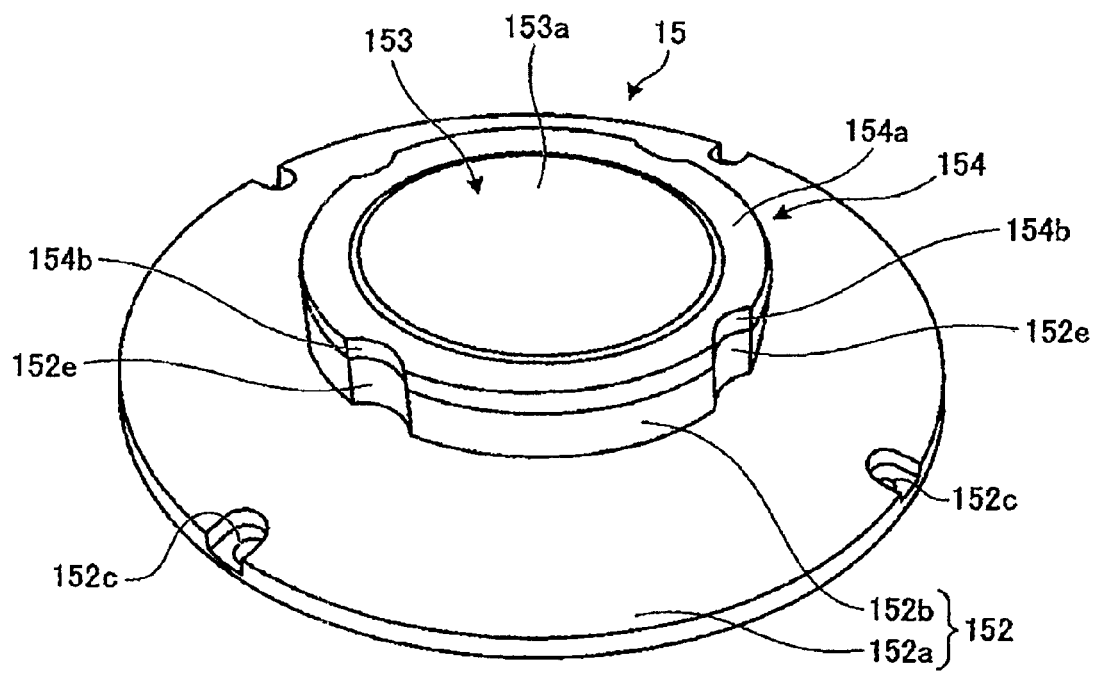
FIG. 2 is a perspective view of the chuck table according to this preferred embodiment.

The chuck table 15 included in the laser processing apparatus 1 will now be described in more detail with reference to FIG. 2. FIG. 2 is a perspective view of the chuck table 15 according to this preferred embodiment. The chuck table 15 has a table base 152 fixed to the upper surface of the θ table 151 (see FIG. 1). The table base 152 includes a disk-shaped base portion 152a and a cylindrical support portion 152b projecting upward from the central portion of the base portion 152a.

The peripheral portion of the base portion 152a is formed with four through holes 152c for fixing the table base 152 to the θ table 151. These through holes 152c are arranged at equal intervals. The upper surface of the θ table 151 is formed with four tapped holes (not shown) respectively corresponding to the four through holes 152c of the base portion 152a. By inserting a bolt through each through hole 152c of the base portion 152a and engaging the bolt to each tapped hole of the θ table 151, the table base 152 can be fixed to the upper portion of the θ table 151.

Figure 3A:
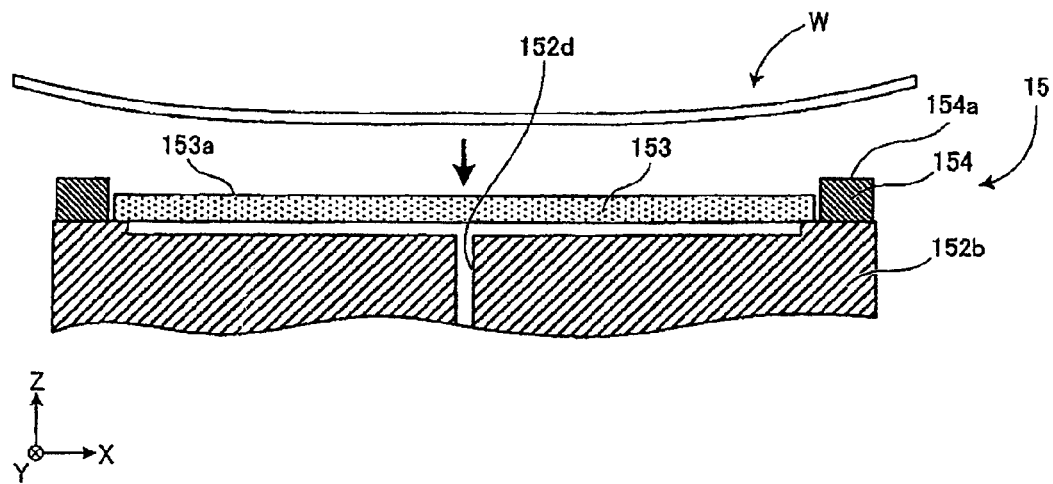
FIGS. 3A to 3C are sectional views showing the operation of the chuck table according to this preferred embodiment in holding a wafer having a warp under suction.

The support portion 152b is a solid cylindrical member and it is formed with a suction passage 152d vertically extending through the support portion 152b (see FIG. 3A). A suction holding member 153 is provided on the central portion of the upper surface of the support portion 152b. The suction holding member 153 is formed of a porous ceramic material. The upper end of the suction passage 152d is covered with the suction holding member 153. The lower end of the suction passage 152d is connected through a pipe to a vacuum source (not shown) such as a vacuum pump. Accordingly, a vacuum is produced in the suction passage 152d by operating the vacuum source, thereby holding the wafer W on a suction holding surface 153a of the suction holding member 153 under suction.

The side surface (cylindrical surface) of the support portion 152b is formed with four notches 152e arranged at equal intervals. These four notches 152e respectively correspond to four hooks of an edge clamp type handling mechanism (not shown) for gripping the peripheral portion (edge portion) of the wafer W. The four hooks gripping the wafer W are respectively inserted into the four notches 152e, thereby allowing the placement of the wafer W on the suction holding surface 153a. Further, by inserting the four hooks into the four notches 152e, the wafer W placed on the suction holding surface 153a can be gripped by the four hooks and transported by the edge clamp type handling mechanism. A handling mechanism for handling the wafer W is not limited to such an edge clamp type handling mechanism. In the case that such an edge clamp type handling mechanism is not used, the support portion 152b may not have the notches 152e.

In the case that the wafer W having a warp is placed on a suction holding member of a conventional chuck table in such a manner that the peripheral portion of the wafer W is higher in level than the central portion of the wafer W, the central portion of the wafer W comes into contact with the suction holding surface of the suction holding member, but the peripheral portion of the wafer W floats over the suction holding surface. In this case, the degree of tight contact between the wafer W and the suction holding member is low, so that the chuck table cannot exert a sufficient suction holding force and therefore cannot properly hold the wafer W.

To solve this problem, the chuck table 15 according to this preferred embodiment includes an annular seal member 154 surrounding the outer circumference of the suction holding member 153. The annular seal member 154 has an inner diameter and an outer diameter such that it can hold the peripheral portion of the wafer W placed on the suction holding surface 153a of the suction holding member 153. The upper surface 154a of the annular seal member 154 is higher in level than the suction holding surface 153a of the suction holding member 153. That is, the height of the upper surface 154a of the annular seal member 154 is set greater than the height of the suction holding surface 153a of the suction holding member 153 according to the warp of the wafer W.

Accordingly, when the wafer W having a warp is placed on the suction holding member 153 in such a manner that the peripheral portion of the wafer W is higher in level than the central portion of the wafer W, the central portion of the wafer W comes into contact with the suction holding surface 153a, and the peripheral portion of the wafer W comes into contact with the upper surface 154a of the annular seal member 154. Since the peripheral portion of the wafer W comes into contact with the upper surface 154a of the annular seal member 154, air-tightness for suction holding of the wafer W can be ensured.

The annular seal member 154 is formed of a fluororubber sponge as an elastic member. More specifically, the annular seal member 154 is formed of a fluororubber sponge having a sponge hardness of 35. By using an elastic member having such a specific sponge hardness for the annular seal member 154, the annular seal member 154 is deformed by a force acting in holding the wafer W on the chuck table 15 under suction (see FIG. 3C). That is, by producing a suitable vacuum in holding the wafer W on the chuck table 15 under suction, the warp of the wafer W can be relaxed to thereby flatten the front side (or back side) of the wafer W. As a result, the processability of the wafer W can be improved.

The elastic member to be used for the annular seal member 154 is not limited to a fluororubber sponge, but any elastic member having a sponge hardness of 30 to 40 may be suitably used for the annular seal member 154. The sponge hardness mentioned above is defined as a value measured by an instrument conforming to SRIS 0101 that is the standard for sponge hardness measuring instrument.

In the case that the annular seal member 154 is too hard (in the case that the annular seal member 154 has a sponge hardness greater than 40), there is a possibility that a local stress may be applied to the wafer W in holding the wafer W on the chuck table 15 under suction, causing any damage to the wafer W. By using the annular seal member 154 having a suitable sponge hardness, the annular seal member 154 can be deformed in holding the wafer W on the chuck table 15 under suction, so that a local stress to the wafer W can be relaxed to thereby prevent the damage to the wafer W.

In the case that the annular seal member 154 is too soft (in the case that the annular seal member 154 has a sponge hardness less than 30), there is a possibility that the annular seal member 154 may adhere to the wafer W in holding the wafer W on the chuck table 15 under suction. In this case, even when the suction holding force of the chuck table 15 is removed, it is not easy to separate the wafer W from the chuck table 15. Accordingly, by using the annular seal member 154 having a suitable sponge hardness, the adhesion of the annular seal member 154 to the wafer W in holding the wafer W under suction can be prevented to thereby allow easy separation of the wafer W from the chuck table 15 after removing the suction holding force.

As shown in FIG. 2, the side surface (outer circumferential surface) of the annular seal member 154 is formed with four notches 154b arranged at equal intervals. These four notches 154b of the annular seal member 154 are formed at the positions respectively corresponding to the positions of the four notches 152e of the support portion 152b. Owing to the formation of the notches 154b, the wafer W can be transported by using an edge clamp type handling mechanism. However, in the case that such an edge clamp type handling mechanism is not used, the annular seal member 154 may not have the notches 154b.

Figure 3B:
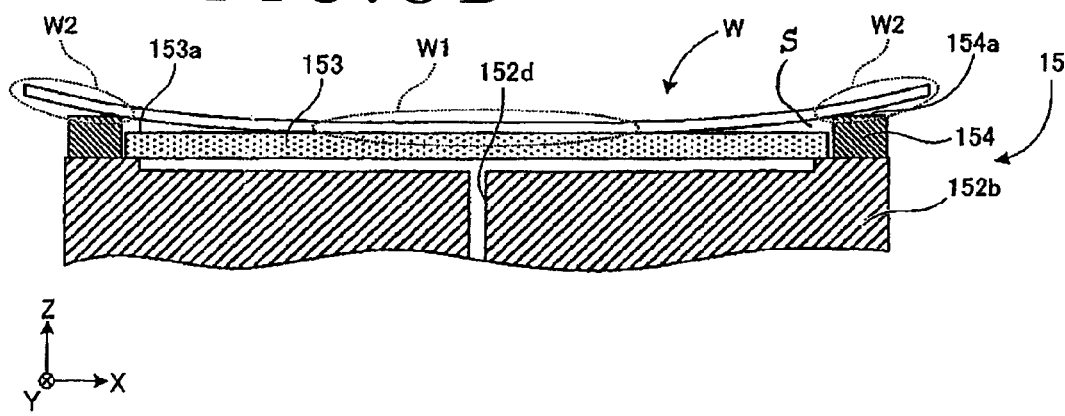
Figure 3C:
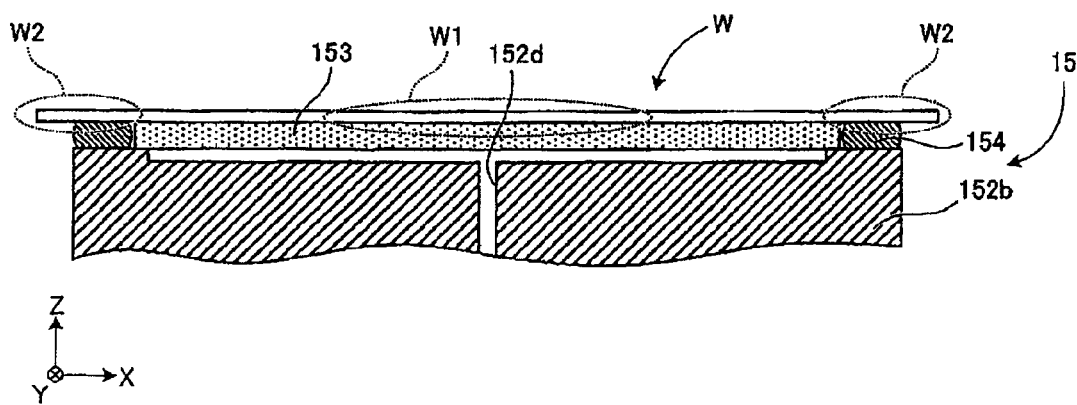

The operation of the chuck table 15 in holding the wafer W having a warp under suction will now be described with reference to FIGS. 3A to 3C. As shown in FIG. 3A, the wafer W is transported to the position above the chuck table 15 by a handling mechanism (not shown). The wafer W is aligned to the suction holding surface 153a and then placed on the suction holding surface 153a. When the wafer W is placed on the suction holding surface 153a, the central portion W1 of the wafer W comes into contact with the suction holding surface 153a as shown in FIG. 3B. In contrast, the peripheral portion W2 of the wafer W is curved upward and therefore does not come into contact with the suction holding surface 153a. However, the peripheral portion W2 of the wafer W comes into contact with the upper surface 154a of the annular seal member 154 surrounding the outer circumference of the suction holding member 153. Since the wafer W comes into contact with the annular seal member 154 as mentioned above, air-tightness in the space S defined by the wafer W and the annular seal member 154 is ensured.

Thereafter, the vacuum source is operated in this condition to thereby produce a vacuum in the suction passage 152d. The suction holding member 153 is formed of a porous ceramic material, so that the vacuum in the suction passage 152d acts on the suction holding member 153 to produce a suction holding force on the suction holding surface 153a. Since the central portion W1 of the wafer W is in contact with the suction holding surface 153a, the central portion W1 is held on the suction holding surface 153a by the suction holding force produced above. On the other hand, the peripheral portion W2 of the wafer W is not in contact with the suction holding surface 153a, so that the vacuum in the suction passage 152d leaks through the gap between the wafer W and the suction holding surface 153a into the space S defined by the wafer W and the annular seal member 154. Accordingly, the space S defined by the wafer W and the annular seal member 154 is evacuated. As a result, a downward force by atmospheric pressure acts on the peripheral portion W2 of the wafer W.

As described above, the annular seal member 154 is formed from an elastic member having a predetermined sponge hardness set so that it is deformed by the force acting on the annular seal member 154 in holding the wafer W under suction. Accordingly, when the downward force by atmospheric pressure acts on the peripheral portion W2 of the wafer W, the annular seal member 154 is sandwiched between the peripheral portion W2 of the wafer W and the support portion 152b and deformed so as to be depressed in the direction of thickness of the annular seal member 154. Further, the warp of the wafer W is reduced by the downward force by atmospheric pressure, so that the front side (upper surface) of the wafer W is flattened. The vacuum to be produced by the vacuum source is suitably adjusted in the range where the above operation is allowed.

In this manner, the chuck table 15 according to this preferred embodiment includes the annular seal member 154 formed from an elastic member adapted to make the contact with the peripheral portion W2 of the wafer W (workpiece). Accordingly, a reduction in air-tightness between the wafer W and the chuck table 15 due to the warp of the wafer W can be prevented to thereby suitably hold the wafer W on the chuck table 15 under suction. Further, the annular seal member 154 is deformed by the vacuum produced in holding the wafer W under suction in such a manner that the front side (upper surface) of the wafer W is flattened, so that the processability of the wafer W can be improved. Further, since the annular seal member 154 is deformed by the vacuum produced in holding the wafer W under suction, a local stress to the wafer W can be relaxed to thereby prevent the damage to the wafer W.

The present invention is not limited to the above preferred embodiment, but various modifications may be made. For example, while the chuck table 15 is applied to a laser processing apparatus in the above preferred embodiment, the chuck table according to the present invention may be applied to various processing apparatuses including such a laser processing apparatus. For example, the chuck table according to the present invention may be applied to a cutting apparatus.

Further, while the upper surface 154a of the annular seal member 154 is formed as a horizontal surface parallel to the suction holding surface 153a, the upper surface of the annular seal member in the present invention is not especially limited. For example, the upper surface of the annular seal member in the present invention may be formed as an inclined surface inclined according to the warp of the wafer (workpiece). In this case, the degree of tight contact between the annular seal member and the wafer can be improved, so that the air-tightness in the space defined by the wafer and the annular seal member can be further improved.

Further, the annular seal member may be replaceable. For example, a plurality of annular seal members having different heights may be prepared and they may be replaced each other according to the warp of the wafer. As a modification, a plurality of chuck tables having annular seal members different in height may be prepared and a suitable one of the plural chuck tables may be selected according to the warp of the wafer. By changing the height of the annular seal member according to the warp of the wafer as mentioned above, the degree of tight contact between the annular seal member and the wafer can be improved. As a result, the air-tightness in the space defined by the wafer and the annular seal member can be further improved.

While the annular seal member 154 has a rectangular cross section (see FIG. 3A) in the above preferred embodiment, the corner of the annular seal member 154 may be chamfered. In this case, a local stress to the wafer can be further relaxed to thereby prevent the damage to the wafer. The other configurations and methods in the above preferred embodiment may be suitably modified without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A chuck table for holding a workpiece having a warp thereon, comprising:
    a suction holding member having an upper surface as a suction holding surface for holding said workpiece under suction;
    an annular seal member provided so as to surround the outer circumference of said suction holding member, said annular seal member having a lower surface and an upper surface for supporting a peripheral portion of said workpiece held on said suction holding surface, said annular seal member being formed from an elastic member;
    a support portion provided below said suction holding member and said annular seal member, said support portion including a seating surface and a radial outermost surface wherein the radial outermost surface of said support portion is completely located radially inwardly of a radial outermost surface of said workpiece held on said suction holding surface; and
    a vacuum source connected to said suction holding member for producing a vacuum and applying the vacuum to said suction holding surface;
    the upper surface of said annular seal member being set higher in level than said suction holding surface according to the warp of said workpiece and the lower surface of said annular seal member being seated upon and in contact with the seating surface of the support portion regardless of whether or not the workpiece is being held under suction;
    whereby when the vacuum produced by said vacuum source is applied to said suction holding surface, the peripheral portion of said workpiece comes into contact with the upper surface of said annular seal member to thereby seal off the vacuum leaking from the gap between said workpiece and said suction holding surface due to the warp of said workpiece, so that said annular seal member is elastically deformed by the vacuum applied to the peripheral portion of said workpiece and the upper surface of said workpiece is therefore flattened to thereby hold the workpiece under suction.

2. The chuck table according to claim 1, wherein the radial outermost surface of the support portion is generally cylindrical in shape.

3. The chuck table according to claim 1, wherein the support portion includes a plurality of notches in the outermost surface thereof.

4. The chuck table according to claim 1, wherein the seating surface of the support portion is a planar surface that extends generally in the same direction as a lower surface of the workpiece.

* * * * *